(12) United States Patent
Zhang et al.

(10) Patent No.: US 10,674,049 B2
(45) Date of Patent: Jun. 2, 2020

(54) IMAGE CAPTURE ASSEMBLY AND AERIAL PHOTOGRAPHING AERIAL VEHICLE

(71) Applicant: SZ DJI TECHNOLOGY CO., LTD., Shenzhen (CN)

(72) Inventors: Lei Zhang, Shenzhen (CN); Hao Liu, Shenzhen (CN); Lei Wang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/962,670

(22) Filed: Apr. 25, 2018

(65) Prior Publication Data

US 2018/0241917 A1 Aug. 23, 2018

Related U.S. Application Data

(63) Continuation of application No. PCT/CN2015/095271, filed on Nov. 23, 2015.

(51) Int. Cl.
*H04N 5/225* (2006.01)
*H05K 1/02* (2006.01)
(Continued)

(52) U.S. Cl.
CPC .......... *H04N 5/2252* (2013.01); *G03B 17/55* (2013.01); *H04N 5/2253* (2013.01); *H04N 5/2254* (2013.01); *H04N 5/2257* (2013.01); *H04N 5/22521* (2018.08); *H05K 1/0203* (2013.01); *H05K 1/0209* (2013.01); *H05K 1/11* (2013.01); *H05K 7/20409* (2013.01); *H05K 7/20463* (2013.01); *H05K 2201/066* (2013.01); *H05K 2201/10121* (2013.01)

(58) Field of Classification Search
None
See application file for complete search history.

(56) References Cited

U.S. PATENT DOCUMENTS 7,180,546 B2 * 2/2007 Kobayashi ........... H04N 5/2253
348/373
9,485,451 B2 * 11/2016 Kawamura .......... H04N 5/2252
(Continued)

FOREIGN PATENT DOCUMENTS

CN 101261983 A 9/2008
CN 103048854 A 4/2013
(Continued)

OTHER PUBLICATIONS

The World Intellectual Property Organization (WIPO) International Search Report for PCT/CN2015/095271 dated Aug. 30, 2016 7 Pages (including translation).

*Primary Examiner* — Cynthia Segura
(74) *Attorney, Agent, or Firm* — Anova Law Group, PLLC

(57) ABSTRACT

An image capture assembly includes a heat-conducting housing, a camera component in the heat-conducting housing, a circuit board adapter, and a heat-conducting sheet. The circuit board adapter is in the heat-conducting housing and electrically coupled to the camera component. The heat-conducting sheet is attached to the camera component and arranged between the camera component and the heat-conducting housing to conduct heat generated by the camera component to the heat-conducting housing.

19 Claims, 5 Drawing Sheets

(51) Int. Cl.
*G03B 17/55* (2006.01)
*H05K 1/11* (2006.01)
*H05K 7/20* (2006.01)

(56) References Cited

U.S. PATENT DOCUMENTS

| | | | | |
|---|---|---|---|---|
| 2006/0056049 | A1* | 3/2006 | Tokiwa | G02B 13/16 359/684 |
| 2009/0237537 | A1* | 9/2009 | Maruyama | G03B 17/02 348/294 |
| 2011/0248367 | A1* | 10/2011 | Yang | H04N 5/2254 257/432 |
| 2011/0304762 | A1* | 12/2011 | Chiu | G02F 1/29 348/335 |
| 2012/0082420 | A1* | 4/2012 | Aoki | H05K 1/0204 385/88 |
| 2012/0287317 | A1* | 11/2012 | Tobinaga | H04N 5/2171 348/294 |
| 2012/0314118 | A1* | 12/2012 | Tobinaga | H04N 5/2253 348/335 |
| 2012/0314119 | A1* | 12/2012 | Tobinaga | H04N 5/2253 348/335 |
| 2013/0076976 | A1* | 3/2013 | Lee | H04N 5/2254 348/374 |
| 2013/0077058 | A1* | 3/2013 | Miyashita | H04N 9/3105 353/52 |
| 2014/0055671 | A1* | 2/2014 | Kawamura | H04N 5/2252 348/374 |
| 2015/0109526 | A1* | 4/2015 | Lee | H04N 5/2257 348/374 |
| 2015/0153611 | A1* | 6/2015 | Hirabayashi | G02F 1/133308 349/5 |
| 2015/0170582 | A1* | 6/2015 | Shimizu | G02F 1/133308 345/206 |
| 2016/0165115 | A1* | 6/2016 | Nakada | H04N 5/2251 348/374 |
| 2016/0174408 | A1* | 6/2016 | Tolbert | H05K 1/0209 348/373 |
| 2017/0223243 | A1* | 8/2017 | Nakamura | H04N 5/2257 |
| 2017/0307841 | A1* | 10/2017 | Nakamura | B60R 11/04 |
| 2018/0176431 | A1* | 6/2018 | Kim | G02B 27/00 |
| 2018/0259807 | A1* | 9/2018 | Yuuki | G02F 1/133606 |
| 2018/0345911 | A1* | 12/2018 | Zurowski | G03B 17/55 |

FOREIGN PATENT DOCUMENTS

| | | |
|---|---|---|
| CN | 204089975 U | 1/2015 |
| CN | 205179197 U | 4/2016 |
| CN | 205283679 U | 6/2016 |
| JP | 2009100374 A | 5/2009 |

\* cited by examiner

IMAGE CAPTURE ASSEMBLY AND AERIAL PHOTOGRAPHING AERIAL VEHICLE

CROSS-REFERENCE TO RELATED APPLICATION

This application is a continuation application of International Application No. PCT/CN2015/095271, filed on Nov. 23, 2015, the entire contents of which are incorporated herein by reference.

TECHNICAL FIELD

The present disclosure relates to the field of image capture and, more particularly, to an image capture assembly and an aerial photographing aerial vehicle containing the image capture assembly.

BACKGROUND

An image capture assembly, e.g., a terminal apparatus, such as a camera, a video camera, or a surveillance camera, carried by an unmanned aerial vehicle (UAV), or a unit arranged in a terminal apparatus for obtaining images, usually includes a lens component and a circuit board coupled to the lens component. The circuit board is generally provided with a plurality of functional circuits for implementing different functions, such as an image sensing circuit, a photoelectric conversion circuit, an image processing circuit, an image transmission circuit, a power supply circuit, a control circuit, and/or the like.

As the image capture assembly becomes more compact and miniaturized, an integration level of the functional circuits is getting higher. That is, the functional circuits need to be integrated in a relatively small and confined space in the image capture assembly. Correspondingly, heat generated by the functional circuits is often difficult to dissipate. As the heat builds up to a certain degree, performance of the functional circuits is degraded, and thus overall performance of the image capture assembly is degraded. Damage to the image capture assembly may occur in some situation. Correspondingly, photographing performance of the aerial photographing aerial vehicle that carries the image capture assembly is also be degraded.

SUMMARY

In accordance with the disclosure, there is provided an image capture assembly. The image capture assembly includes a heat-conducting housing, a camera component in the heat-conducting housing, a circuit board adapter, and a heat-conducting sheet. The circuit board adapter is in the heat-conducting housing and electrically coupled to the camera component. The heat-conducting sheet is attached to the camera component and arranged between the camera component and the heat-conducting housing to conduct heat generated by the camera component to the heat-conducting housing.

Also in accordance with the disclosure, there is provided an image capture assembly. The image capture assembly includes a heat-conducting housing, a camera component in the heat-conducting housing, a circuit board adapter, and a heat-conducting filler. The circuit board adapter is in the heat-conducting housing and electrically coupled to the camera component. The heat-conducting filler is filled between the camera component and the circuit board adapter to conduct heat generated by the camera component to the heat-conducting housing through the circuit board adapter.

Figure 1:
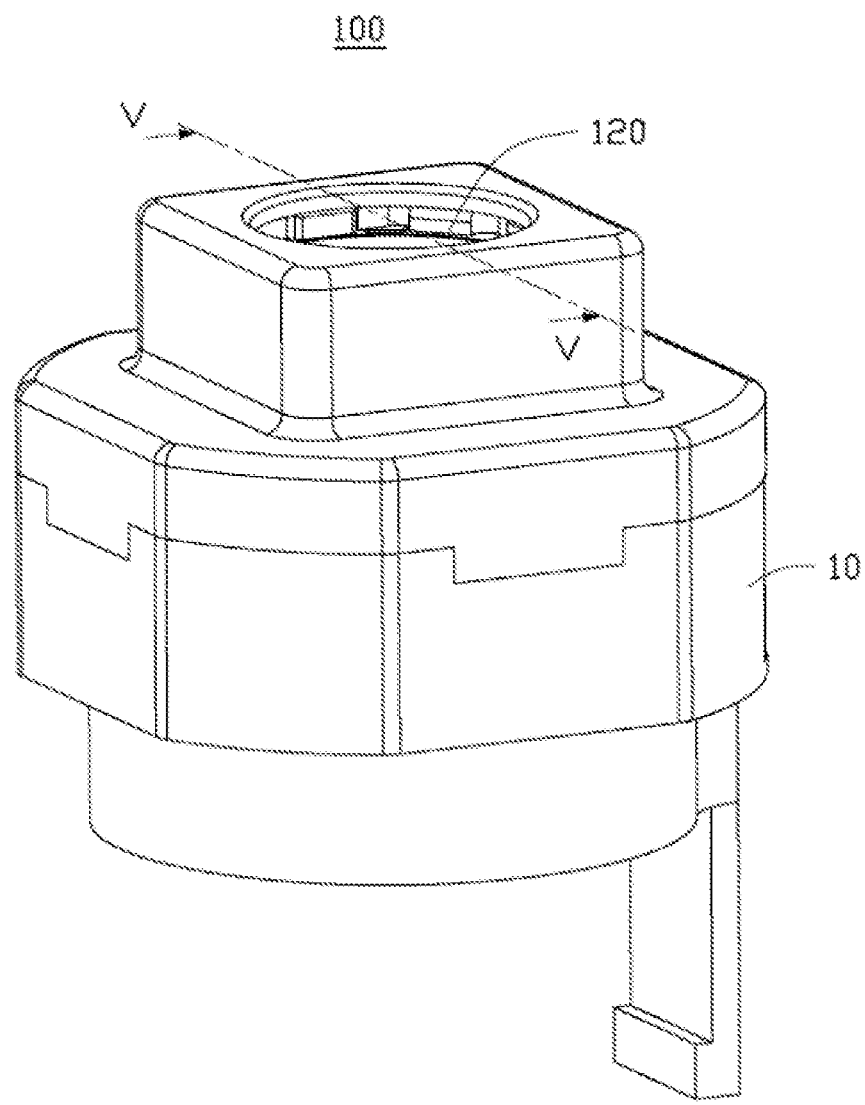
FIG. 1 is a perspective assembly view of an exemplary image capture assembly consistent with disclosed embodiments.

Reference numerals used in the drawings include: 100, image capture assembly; 10, housing; 12, first housing; 120, accommodating space; 122, coupling portion; 124, accommodating portion; 1240, side wall of accommodating portion; 1242, top wall of accommodating portion; 1244, light inlet; 14, second housing; 142, flange; 20, camera component; 22, circuit board; 222, supporting surface; 224, coupling surface; 226, male connector; 24, image sensor; 26, lens component; 262, lens housing; 2622, side wall of lens component; 2624, first open end; 2626, second open end; 264, filter plate; 30, heat-conducting sheet; 40, circuit board adapter; 42, adapter plate; 422, first surface; 424, second surface; 426, female connector; 44, first electronic component; 46, second electronic component; 50, first heat-conducting filler; 60, heat sink; 62, heat dissipation body; 64, heat dissipation fins; and 70, second heat-conducting filler.

DETAILED DESCRIPTION OF THE EMBODIMENTS

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

Exemplary embodiments will be described with reference to the accompanying drawings, in which the same numbers refer to the same or similar elements unless otherwise specified.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "perpendicular," "horizontal," "left," "right," and similar expressions used herein are merely intended for description.

Unless otherwise defined, all the technical and scientific terms used herein have the same or similar meanings as generally understood by one of ordinary skill in the art. As described herein, the terms used in the specification of the present disclosure are intended to describe exemplary embodiments, instead of limiting the present disclosure. The term "and/or" used herein includes any suitable combination of one or more related items listed.

Further, in the present disclosure, the disclosed embodiments and the features of the disclosed embodiments may be combined as long as there are no conflicts.

FIG. 1 is a perspective assembly view of an exemplary image capture assembly 100 consistent with disclosed embodiments. As shown in FIG. 1, the image capture assembly 100 includes an aerial photographing apparatus. The image capture assembly 100 can be carried by an aerial vehicle (not shown) through a gimbal (not shown), such that an aerial photographing aerial vehicle is formed. Further, the image capture assembly may be controlled in a remote control manner for performing aerial photographing. Further, the image capture assembly 100 can wirelessly transmit captured images to a ground receiving apparatus (not shown).

Figure 2:
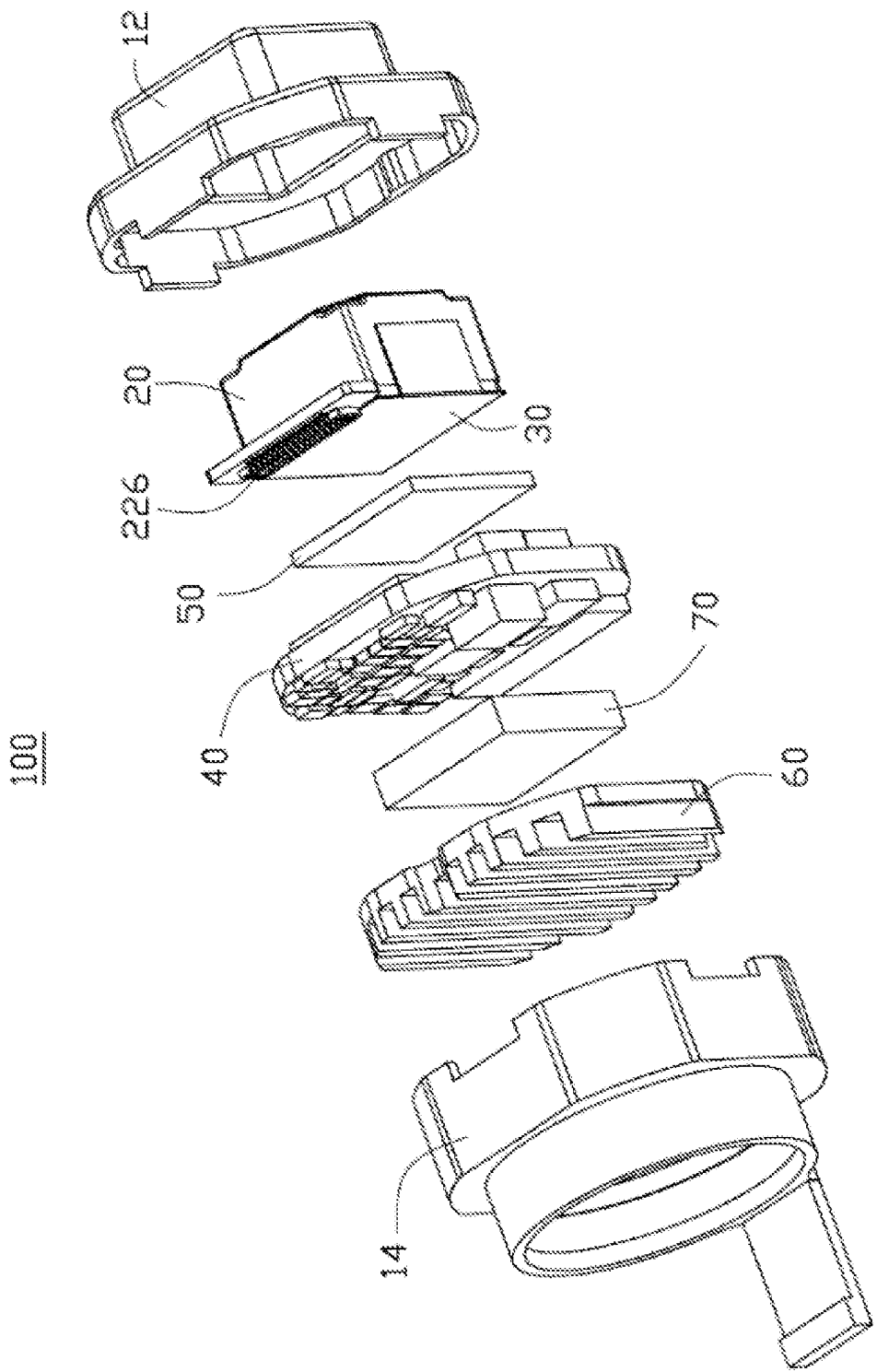
FIG. 2 is an exploded view of the exemplary image capture assembly shown in FIG. 1 consistent with disclosed embodiments.

FIG. 2 is an exploded view of the exemplary image capture assembly shown in FIG. 1 consistent with disclosed embodiments. Referring to FIGS. 1 and 2, the image capture assembly 100 includes a housing 10, also referred to as a "heat-conducting housing," a camera component 20, a heat-conducting sheet 30, a circuit board adapter 40, a first heat-conducting filler 50, a heat sink 60, and a second heat-conducting filler 70.

The housing 10 can be made of a heat-conducting material and includes a first housing 12 and a second housing 14. The first housing 12 is coupled to the second housing 14 to form an accommodating space 120 for accommodating the camera component 20, the heat-conducting sheet 30, the circuit board adapter 40, the first heat-conducting filler 50, the heat sink 60, and the second heat-conducting filler 70. In some embodiments, the heat-conducting material of the housing 10 may include a metal such as copper or aluminum, and/or may include a non-metal material, such as carbon fiber.

Figure 3:
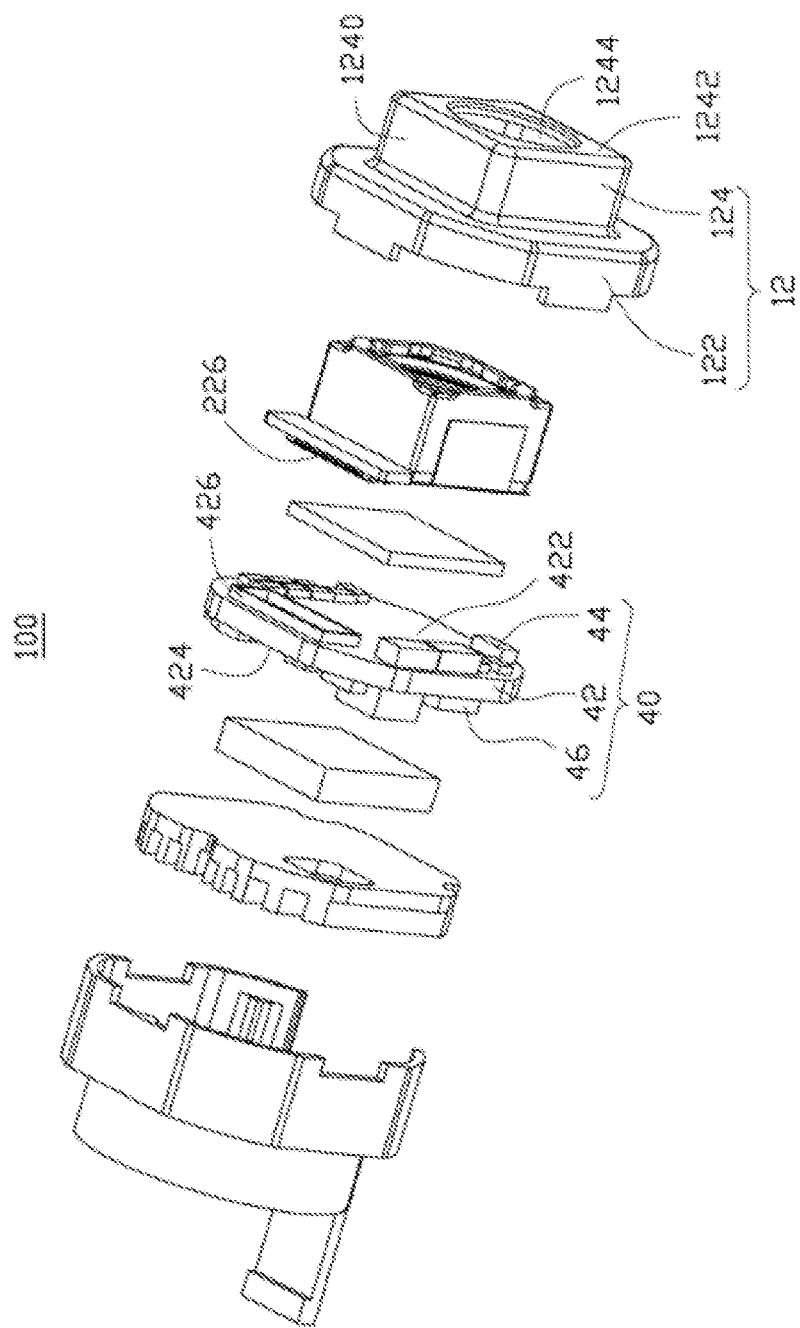
FIG. 3 is another exploded view of the exemplary image capture assembly shown in FIG. 1 consistent with disclosed embodiments.
Figure 4:
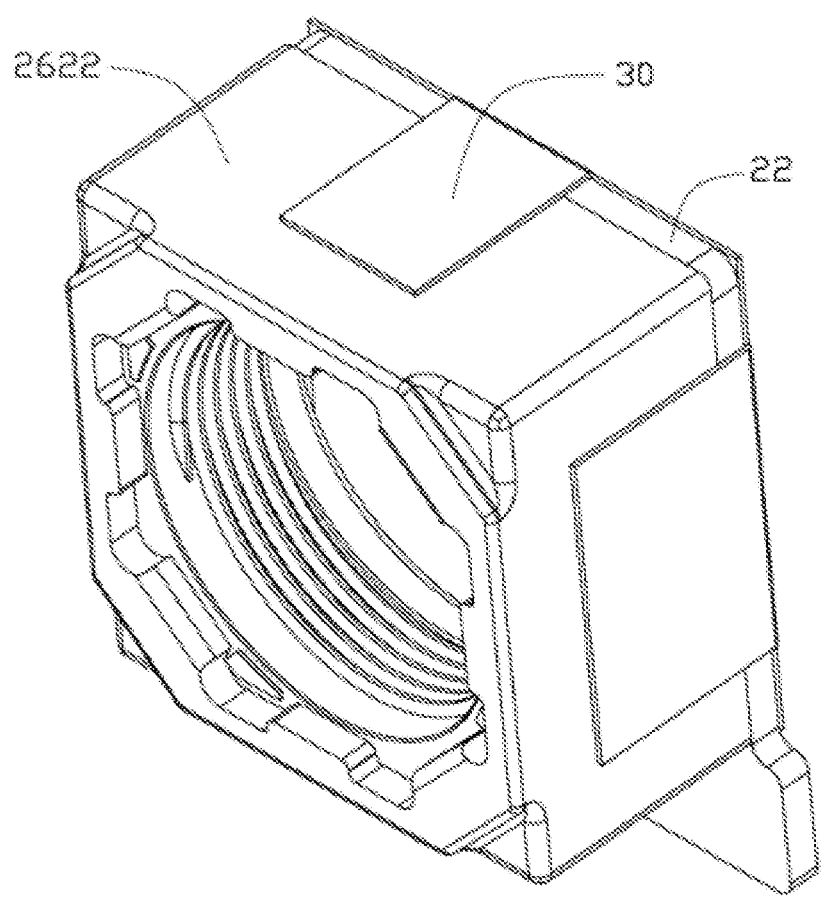
FIG. 4 is a perspective view of an exemplary lens component of the exemplary image capture assembly shown in FIG. 1 consistent with disclosed embodiments.
Figure 5:
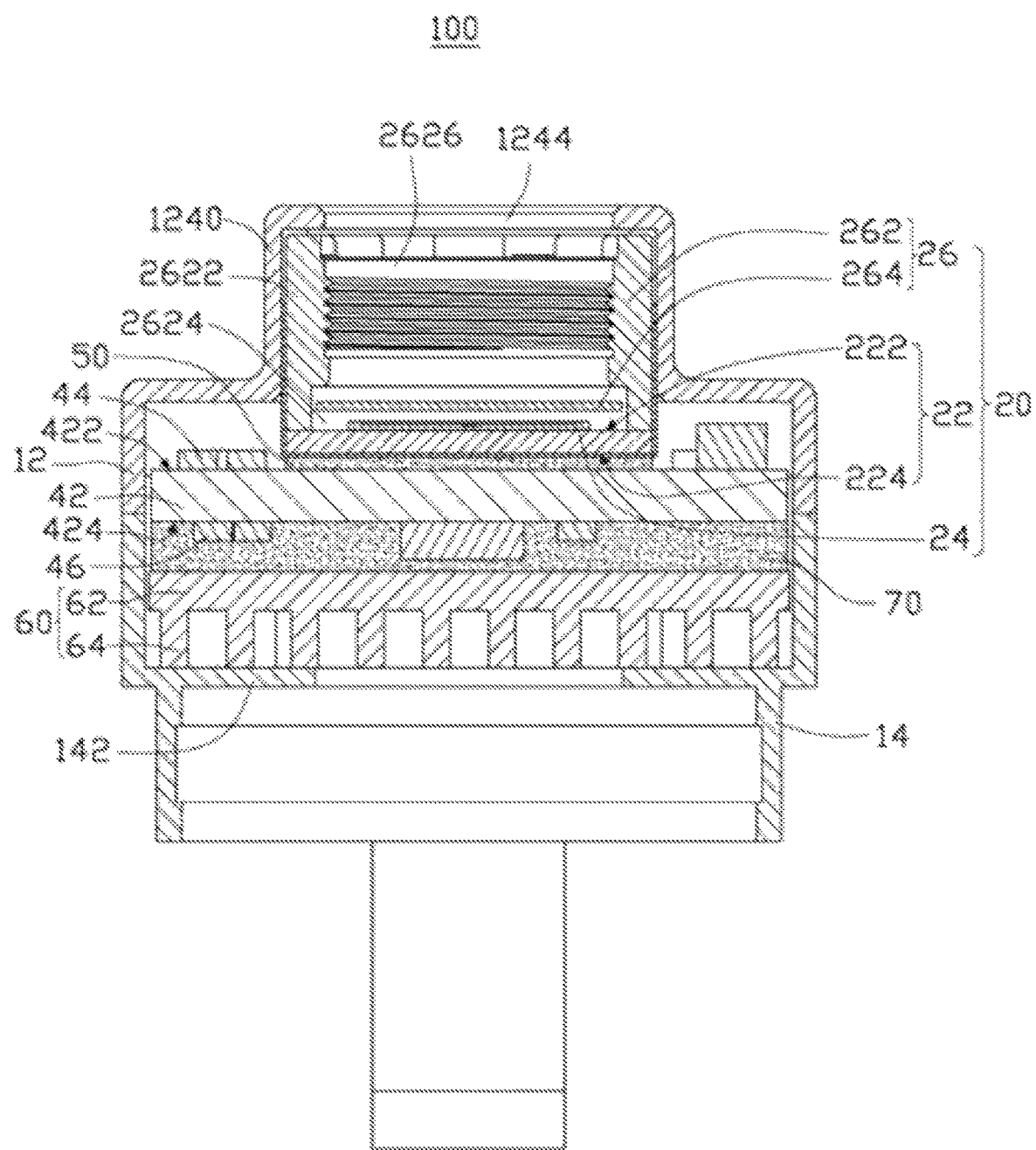
FIG. 5 is a schematic cross-sectional view of the image capture assembly shown in FIG. 1 along line V-V consistent with disclosed embodiments.

Referring to FIGS. 2 to 4, the first housing 12 includes a coupling portion 122 and an accommodating portion 124 extending outward from the coupling portion 122. The coupling portion 122 is coupled to the second housing 14 to form the accommodating space 120. The accommodating portion 124 is coupled to the coupling portion 122. In some embodiments, the accommodating portion 124 has a cubic structure and includes four side walls 1240 and a top wall 1242 coupled to the four side walls 1240. The top wall 1242 includes a light inlet 1244. Referring to FIG. 5, an inner wall of the second housing 14 extends inwardly to form a flange 142. In some embodiments, the first housing 12 and the second housing 14 may be coupled to each other in a snap-on manner. The flange 142 may have a continuous annular structure, such as a continuous circular ring structure.

It some other embodiments, the first housing 12 and the second housing 14 may be coupled to each other by screwing, gluing, welding, or the like. The flange 142 may have an annular structure with four sides or may have another shape. In some embodiments, the flange 142 may have a discontinuous structure, such as an annular structure that is intermediately intermittent. Further, the accommodating portion 124 is not limited to the above-described cubic structure. The accommodating portion 124 may have, for example, a cylindrical structure. Correspondingly, the accommodating portion 124 may include only one cylindrical side wall.

The camera component 20 includes a circuit board 22, an image sensor 24, and a lens component 26. The circuit board 22 includes a supporting surface 222 and a coupling surface 224 opposite to the supporting surface 222. The image sensor 24 is supported by the supporting surface 222 and is electrically coupled to the circuit board 22. The lens component 26 is supported by the supporting surface 222 and accommodates the image sensor 24. As shown in FIG. 5, the lens component 26 includes a filter plate 264 and a lens housing 262 for accommodating lenses (not shown) and having two open ends. In some embodiments, as shown in FIGS. 4 and 5, the lens housing 262 includes a lens barrel having a cubic structure, including four side walls 2622, a first open end 2624, and a second open end 2626. The lens housing 262 is accommodated in the accommodating portion 124. The four side walls 2622 of the lens housing 262 are aligned with the four side walls 1240 of the accommodating portion 124. The second open end 2626 is aligned with the light inlet 1244. The filter plate 264 is accommodated in the lens housing 262. The circuit board 22 seals the first open end 2624. A male connector 226 is provided to, e.g., attached to, the coupling surface 224 of the circuit board 22, as shown in, e.g., FIGS. 2 and 3.

The heat-conducting sheet 30 is attached to the camera component 20 and is arranged between the camera component 20 and the housing 10 to conduct heat generated by the camera component 20 to the housing 10. Referring to FIGS. 2, 4, and 5, the heat-conducting sheet 30 extends from the coupling surface 224 of the circuit board 22 to the two side walls 2622 of the lens housing 262. The heat-conducting sheet 30 at the two side walls 2622 of the lens housing 262 is in direct contact with the two side walls 1240 of the accommodating portion 124. The heat-conducting sheet may be formed by a heat-conducting gold foil, a heat-conducting silver foil, a heat-conducting aluminum foil, a heat-conducting copper foil, and/or another metal material. In some embodiments, the heat-conducting sheet 30 may be formed by a heat-conducting copper foil. During an operation of the image sensor 24, heat generated by the image sensor 24 may be conducted to the circuit board 22, and further conducted to the side walls 1240 of the first housing 12 through the heat-conducting sheet 30, and further dissipated from the first housing 12. Accordingly, a first heat dissipation channel for the camera component 20 may be formed.

The heat-conducting sheet 30 is not limited to being made of a metal material. In some embodiments, the heat-conducting sheet may be made of a non-metal material, e.g., a heat-conducting silicone sheet or a heat-conducting graphite sheet. The heat-conducting sheet 30 is not limited to the above-described manner that the heat-conducting sheet 30 extends from the coupling surface 224 of the circuit board 22 to the two side walls 2622 of the lens housing 262, and the heat-conducting sheet 30 at the two side walls 2622 of the lens housing 262 is in direct contact with the two side walls 1240 of the accommodating portion 124. In some embodiments, the heat-conducting sheet 30 at the two side walls 2622 of the lens housing 262 may be in an indirect contact with the two side walls 1240 of the accommodating portion 124 through another heat-conducting medium. In some embodiments, the heat-conducting sheet 30 at the two side walls 2622 and the two side walls 1240 of the accommodating portion 124 may be neither in direct contact nor in indirect contact, but may be spaced apart and maintained in a relative relation, e.g., a relation of facing toward each other. In some embodiments, the portion of the heat-conducting sheet 30 at one side wall 2622 of the lens housing 262 may be in direct contact with a corresponding side wall

1240, and the portion of the heat-conducting sheet 30 at another side wall 2622 of the lens housing 262 may be in indirect contact with another corresponding side wall 1240 through another heat-conducting medium. In some embodiments, the portion of the heat-conducting sheet 30 at one side wall 2622 of the lens housing 262 may be in direct contact with a corresponding side wall 1240, and the portion of the heat-conducting sheet 30 at another side wall 2622 of the lens housing 262 may be spaced apart from another corresponding side wall 1240. In some embodiments, the portion of the heat-conducting sheet 30 at one side wall 2622 of the lens housing 262 may be in indirect contact with a corresponding side wall 1240 through other heat-conducting medium, and the portion of the heat-conducting sheet 30 at another side wall 2622 of the lens housing 262 may be spaced apart from another corresponding side wall 1240.

In addition, the heat-conducting sheet 30 is not limited to the above-described manner of extenting to two side walls 2622 of the lens housing 262. The heat-conducting sheet 30 may extend to only one side wall 2622 of the lens housing 262. Correspondingly, the heat-conducting sheet 30 at the one sidewall 2622 and a corresponding side wall 1240 of the accommodating portion 124 may be in direct contact with each other, may be in indirect contact with each other, or may be spaced apart from each other. In some embodiments, the heat-conducting sheet 30 may extend to three side walls 2622 or even four side walls 2622 of the lens housing 262, and the portion of the heat-conducting sheet 30 at each of the side walls 2622 and the corresponding side wall 1240 of the accommodating portion 124 may be in direct contact with each other, may be in indirect contact with each other, or may be spaced apart from each other. In order to improve the heat conductivity, in some embodiments, the heat-conducting sheet 30 may extend to a plurality of side walls 2622 of the lens housing 262, and the portion of the heat-conducting sheet 30 at each of the side walls 2622 may be in direct contact with the corresponding side wall 1240. In addition, the heat-conducting sheet 30 is not limited to above-described manner that the heat-conducting sheet 30 extends from the coupling surface 224 of the circuit board 22. The heat-conducting sheet 30 may extend from any surface of the circuit board 22. For example, the heat-conducting sheet 30 may extend from the supporting surface 222 or from a side that couples the supporting surface 222 to the coupling surface 224, as long as the heat-conducting sheet 30 can be in contact with both the circuit board 22 and the side wall(s) 2622 of the lens housing 262 at a same time, and the heat-conducting sheet 30 at the side wall(s) 2622 of the lens housing 262 can be in contact with the first housing 12.

In some embodiments, the accommodating portion 124 may have a cylindrical structure. Correspondingly, the lens housing 262 may include a lens barrel having a cylindrical structure, and may include a cylindrical side wall. The lens housing 262 may be accommodated in the accommodating portion 124. The cylindrical side wall of the lens housing 262 may correspond to, e.g., be aligned with, a cylindrical side wall of the accommodating portion 124. Correspondingly, the heat-conducting sheet 30 may extend from the coupling surface 224 of the circuit board 22 to the cylindrical side wall of the lens housing 262. The heat-conducting sheet 30 at the cylindrical side wall of the lens housing 262 may be in contact with the cylindrical side wall of the accommodating portion 124.

The circuit board adapter 40 may be electrically coupled to the camera component 20 and supply power to the camera component 20. The circuit board adapter 40 includes an adapter plate 42, a plurality of first electronic components 44, and a plurality of second electronic components 46. The adapter plate 42 includes a first surface 422 and a second surface 424 opposite to each other. The plurality of first electronic components 44 may be electrically coupled to the first surface 422, and the plurality of second electronic components 46 may be electrically coupled to the second surface 424. The first surface 422 is provided with a female connector 426. For example, the female connector 426 may be attached to the first surface 422. The male connector 226 may be inserted into the female connector 426, such that the circuit board 22 and the circuit board adapter 40 may be plugged together. In some embodiments, the male connector 226 may include a plug and the female connector 426 may include a socket. The plurality of first electronic components 44 and the plurality of second electronic components 46 may include, but are not limited to, an image processing circuit, an image transmission circuit, a power supply circuit, a control circuit, and/or the like.

The positional arrangements of the male connector 226 and the female connector 426 are not limited to the above-described manner. The positions of the two connectors can be interchanged. For example, the male connector may be coupled to the first surface 422, and the female connector may be coupled to the coupling surface 224 of the circuit board 22. The male connector 226 is not limited to the above-described plug, and the female connector 426 is not limited to the above-described socket. The male connector 226 and the female connector 426 may include other plug-in structures.

The first heat-conducting filler 50 is filled between the circuit board 22 and the circuit board adapter 40. In some embodiments, the first heat-conducting filler 50 is filled between the heat-conducting sheet 30 at the coupling surface 224 and the first surface 422, and covers the plurality of first electronic components 44. That is, the opposite sides of the first heat-conducting filler 50 may be in contact with the heat-conducting sheet 30 and the first surface 422, respectively. As described above, in some embodiments, the heat-conducting sheet 30 may extend from the side that couples the supporting surface 222 and the coupling surface 224. In these embodiments, the opposite sides of the first heat-conducting filler 50 may be in direct contact with the coupling surface 224 and the first surface 422, respectively. The first heat-conducting filler 50 may include at least one of a heat-conducting clay or a heat-conducting paste. In some embodiments, the first heat-conducting filler 50 may include a heat-conducting clay.

The heat sink 60 may be made of an aluminum alloy and be disposed at the second surface 424 and in contact with the housing 10. As shown in FIG. 5, the heat sink 60 includes a heat dissipation body 62 and a plurality of heat dissipation fins 64 extending outward from the heat dissipation body 62. The heat dissipation body 62 may be disposed at the second surface 424. The plurality of heat dissipation fins 64 may have a long plate-shaped structure, and may be parallel to each other, spaced apart from each other, and arranged at the side of the heat dissipation body 62 facing away from the second surface 424. Some or all of the plurality of heat dissipation fins 64 may be supported by the flange 142. The heat dissipation fins 64 are not limited to the above-described long plate-shaped structure, and may include, for example, an annular structure including layers, or a column structure including columns discretely or regularly arranged. A cross section of the column structure can include a regular and/or an irregular shape, such as a circular shape, a triangle, a rectangle, a square, etc. The heat sink 64 is not limited to the above-described aluminum alloy material, and may be made of another alloy material such as a copper alloy.

The second heat-conducting filler 70 is filled between the heat sink 60 and the second surface 424. As shown in FIG. 5, the second heat-conducting filler 70 is filled between the heat dissipation body 62 and the second surface 424, and covers the plurality of second electronic components 46. That is, opposite sides of the second heat-conducting filler 70 are in contact with the heat dissipation body 62 and the second surface 424, respectively. The second heat-conducting filler 70 may include at least one of a heat-conducting clay or a heat-conducting paste. In some embodiments, the second heat-conducting filler 70 may include a heat-conducting clay.

During an operation of the camera component 20, the heat generated by the image sensor 24 or other components in the camera component 20 may be conducted to the second housing 14 through the circuit board 22, the heat-conducting sheet 30, the first heat-conducting filler 50, the circuit board adapter 40, the second heat-conducting filler 70, and the heat sink 60, and further be dissipated from the heat sink 60 and the second housing 14. Accordingly, a second heat dissipation channel for the camera component 20 may be formed. Further, heat generated by the circuit board adapter 40 may also be conducted to the heat sink 60 through the second heat-conducting filler 70, and may be dissipated from the heat sink 60 and the second housing 14. In addition, the heat sink 60 may be coupled to the second housing 14, and the heat dissipation area may be increased by the second housing 14, further improving a heat dissipation efficiency. The setting of the first heat dissipation channel can improve the heat dissipation efficiency of the camera component 20. With the second heat dissipation channel, the heat dissipation efficiency of the camera component 20 may be improved by about 50% as compared to that with only the first heat dissipation channel. Further, the first heat-conducting filler 50 covers the plurality of first electronic components 44, and the second heat-conducting filler 70 covers the plurality of second electronic components 46. As a result, the plurality of first electronic components 44 and the plurality of second electronic components 46 may experience an effect of immersive heat dissipation, and hence the heat dissipation efficiency of the circuit board adapter 40 can be further improved.

In the image capture assembly 100 of the disclosure, the heat-conducting sheet 30 covers the camera component 20 and be arranged between the camera component 20 and the heat-conducting housing 10, thereby conducting heat generated by the camera component 20 to the heat-conducting housing 10. Heat generated by the camera component 20 can also be conducted to the second housing 14 through the circuit board 22, the heat-conducting sheet 30, the first heat-conducting filler 50, the circuit board adapter 40, the second heat-conducting filler 70, and the heat sink 60; and the heat can be dissipated from the heat sink 60 and the second housing 14, further improving the heat dissipation efficiency of the camera component 20. In addition, the first heat-conducting filler 50 covers the plurality of first electronic components 44, and the second heat-conducting filler 70 covers the plurality of second electronic components 46. The plurality of first electronic components 44 and the plurality of second electronic components 46 may experience an effect of immersive heat dissipation, thereby further improving an overall heat dissipation efficiency of the image capture assembly 100.

In some embodiments, the heat-conducting sheet 30 may be omitted. Correspondingly, heat generated by the image sensor 24 or other components of the camera component 20 may be conducted to the second housing 14 through the circuit board 22, the first heat-conducting filler 50, the circuit board adapter 40, the second heat-conducting filler 70, and the heat sink 60; and the heat may be further dissipated from the heat sink 60 and the second housing 14. In some embodiments, the heat sink 60 may be omitted. Correspondingly, one side of the circuit board adapter 40 may be in direct contact with an inner wall of the housing 10 or in indirect contact with the inner wall of the housing 10 through another heat-conducting medium including the second heat-conducting filler 70 of the disclosure, such that heat may be dissipated to the housing 10. In some embodiments, a bottom surface of the circuit board adapter 40 may be in direct contact with the flange 142 or in indirect contact with the flange 142 through another heat-conducting medium including the second heat-conducting filler 70 of the disclosure, such that heat may be dissipated to the housing 10. In some embodiments, one side of the circuit board adapter 40 may be in direct contact with an inner wall of the housing 10 or in indirect contact with the inner wall of the housing 10 through another heat-conducting medium including the second heat-conducting filler 70 of the disclosure, and a bottom surface of the circuit board adapter 40 may be in direct contact with the flange 142 or in indirect contact with the flange 142 through another heat-conducting medium, such that heat may be dissipated to the housing 10. In some embodiments, the circuit board adapter 40 and the housing 10 may be neither in direct contact with each other nor in indirect contact with each other. Rather, a portion of the circuit board adapter 40 and a portion of the housing 10 may face each other. As such, the heat transferred through the circuit board adapter 40 can also be dissipated to the housing 10. In some embodiments, both the heat-conducting sheet 30 and the heat sink 60 can be omitted.

The present disclosure provides an image capture assembly and an aerial photographing aerial vehicle containing the image capture assembly. The image capture assembly may include a heat-conducting housing, a camera component, a circuit board adapter, a heat-conducting sheet. The camera component and the circuit board adapter may both be accommodated in the housing. The circuit board adapter may be electrically coupled to the camera component. The heat-conducting sheet may cover the camera component and may be arranged between the camera component and the housing to conduct heat generated by the camera component to the housing.

Other embodiments of the disclosure will be apparent to those skilled in the art from consideration of the specification and practice of the embodiments disclosed herein. It is intended that the specification and examples be considered as exemplary only and not to limit the scope of the disclosure, with a true scope and spirit of the invention being indicated by the following claims.

What is claimed is:

1. An image capture assembly comprising:
   a heat-conducting housing;
   a camera component in the heat-conducting housing, the camera component including:
      a circuit board; and
      a lens component supported by the circuit board and including a lens housing for accommodating lenses;
   a circuit board adapter in the heat-conducting housing and electrically coupled to the circuit board; and
   a heat-conducting sheet attached to the camera component and arranged between the camera component and the heat-conducting housing to dissipate heat generated by the camera component to the heat-conducting housing, the heat-conducting sheet extending to a side wall of the lens housing from a side of the circuit board that faces away from the lens component.

2. The image capture assembly according to claim 1, wherein:
the camera component further includes an image sensor supported by the circuit board, electrically coupled to the circuit board, and accommodated by the lens component;
the lens housing includes a first open end and a second open end; and
the circuit board seals the first open end of the lens housing, and the second open end of the lens housing is exposed through the heat-conducting housing.

3. The image capture assembly according to claim 2, wherein:
the circuit board and the circuit board adapter are plugged together; and
a heat-conducting filler is filled between the circuit board and the circuit board adapter.

4. The image capture assembly according to claim 3, wherein:
the circuit board adapter includes an adapter plate and a plurality of electronic components;
the adapter plate includes a first surface and a second surface opposite to each other;
the plurality of electronic components are electrically arranged at the first surface; and
the circuit board are plugged to the circuit board adapter at the first surface.

5. The image capture assembly according to claim 4, wherein:
the circuit board includes one of a male connector or a female connector;
the first surface includes the other one of the male connector or the female connector; and
the male connector is inserted in the female connector.

6. The image capture assembly according to claim 4, wherein the heat-conducting filler covers the plurality of electronic components.

7. The image capture assembly according to claim 4, further comprising:
a heat sink arranged at the second surface and contacting the heat-conducting housing;
wherein:
the heat-conducting filler is a first heat-conducting filler; and
a second heat-conducting filler is filled between the heat sink and the second surface.

8. The image capture assembly according to claim 7, wherein:
the electronic components are first electronic components;
the circuit board adapter includes a plurality of second electronic components;
the plurality of second electronic components are electrically coupled to the second surface; and
the second heat-conducting filler completely covers the plurality of second electronic components.

9. The image capture assembly according to claim 8, wherein:
the heat sink includes a heat dissipation body and a plurality of heat dissipation fins extending outward from the heat dissipation body;
the heat dissipation body is disposed at the second surface; and
the plurality of heat dissipation fins are spaced apart from each other and arranged at a side of the heat dissipation body facing away from the second surface.

10. The image capture assembly according to claim 9, wherein:
the heat-conducting housing includes a first housing and a second housing; and
the first housing is coupled to the second housing to form an accommodating space for accommodating the camera component, the circuit board adapter, and the heat sink.

11. The image capture assembly according to claim 10, wherein:
the first housing includes a coupling portion and an accommodating portion extending outward from the coupling portion;
the coupling portion is coupled to the second housing to form the accommodating space;
the lens housing is accommodated in the accommodating portion; and
the side wall of the lens housing is aligned with a side wall of the accommodating portion.

12. The image capture assembly according to claim 11, wherein:
the accommodating portion includes a light inlet;
the second open end is aligned with the light inlet;
an inner wall of the second housing extends inwardly to form a flange; and
the plurality of heat dissipation fins are supported by the flange.

13. The image capture assembly according to claim 3, wherein the heat-conducting filler includes at least one of a heat-conducting clay or a heat-conducting paste.

14. The image capture assembly according to claim 1, wherein:
the lens housing includes a plurality of side walls; and
the heat-conducting sheet extends to more than one of the plurality of side walls of the lens housing from the side of the circuit board that faces away from the lens component.

15. The image capture assembly according to claim 1, wherein:
the lens housing includes a cylindrical side wall, and
the heat-conducting sheet extends to the cylindrical side wall of the lens housing from the side of the circuit board that faces away from the lens component.

16. The image capture assembly according to claim 1, wherein the heat-conducting sheet at the side wall of the lens housing is in direct contact with the heat-conducting housing.

17. The image capture assembly according to claim 1, wherein the heat-conducting sheet at the side wall of the lens housing is in indirect contact with the heat-conducting housing.

18. The image capture assembly according to claim 1, wherein the heat-conducting sheet at the side wall of the lens housing is spaced apart from the heat-conducting housing and faces toward heat-conducting housing.

19. An image capture assembly comprising:
a heat-conducting housing;
a camera component in the heat-conducting housing, the camera component including:
a circuit board including an upper surface and a lower surface;
a lens component coupled to the upper surface of the circuit board and including a lens housing for accommodating lenses;

a circuit board adapter in the heat-conducting housing and electrically coupled to the circuit board at the lower surface of the circuit board, the circuit board adapter including a plurality of electronic components, a heat-conducting sheet attached to the camera component and extending from the lower surface of the circuit board to a side wall of the lens housing, to dissipate heat generated by the camera component to the heat-conducting housing; and a heat-conducting filler filled between the circuit board and the circuit board adapter and covering the plurality of electronic components, to dissipate heat generated by the camera component to the heat-conducting housing through the circuit board adapter.

* * * * *